United States Patent
Rombach (10) Patent No.: US 9,991,822 B2
(45) Date of Patent: Jun. 5, 2018

(54) MEMS COMPONENT AND METHOD FOR THE PRODUCTION THEREOF

(71) Applicant: EPCOS AG, München (DE)

(72) Inventor: Pirmin Hermann Otto Rombach, Kongens Lyngby (DK)

(73) Assignee: TDK Corporation, Tokyo (JP)

( * ) Notice: Subject to any disclaimer, the term of this patent is extended or adjusted under 35 U.S.C. 154(b) by 585 days.

(21) Appl. No.: 14/420,871

(22) PCT Filed: Aug. 1, 2013

(86) PCT No.: PCT/EP2013/066208
§ 371 (c)(1),
(2) Date: Feb. 10, 2015

(87) PCT Pub. No.: WO2014/026857
PCT Pub. Date: Feb. 20, 2014

(65) Prior Publication Data
US 2015/0207435 A1    Jul. 23, 2015

(30) Foreign Application Priority Data

Aug. 14, 2012   (DE) .......................... 10 2012 107 457

(51) Int. Cl.
*H02N 1/08*         (2006.01)
*B81B 3/00*         (2006.01)

(52) U.S. Cl.
CPC ............. *H02N 1/08* (2013.01); *B81B 3/0072* (2013.01)

(58) Field of Classification Search
CPC ...... H02N 1/08; B81B 3/0072; H04R 19/005; H04R 19/016; H04R 19/04; H04R 23/006; H04R 2201/003
USPC ........ 310/300, 308, 309; 381/174, 175, 191, 381/113, 116
See application file for complete search history.

(56) References Cited

U.S. PATENT DOCUMENTS

| | | |
|---|---|---|
| 2007/0007858 A1 | 1/2007 | Sorensen et al. |
| 2008/0175418 A1 | 7/2008 | Zhang |
| 2008/0212409 A1 | 9/2008 | Lutz |
| 2010/0158279 A1* | 6/2010 | Conti ................ H04R 7/24 381/174 |
| 2010/0158280 A1 | 6/2010 | Coronato et al. |
| 2013/0223023 A1 | 8/2013 | Dehe et al. |

(Continued)

FOREIGN PATENT DOCUMENTS

| | | |
|---|---|---|
| CN | 101584226 A | 11/2009 |
| DE | 112007002441 T5 | 1/2010 |
| JP | H09508777 A | 9/1997 |

(Continued)

OTHER PUBLICATIONS

International Preliminary Report on Patentability for PCT Application No. PCT/EP2013/066208 dated Feb. 26, 2015 (6 pages).

*Primary Examiner* — Quyen Leung
*Assistant Examiner* — Eric Johnson
(74) *Attorney, Agent, or Firm* — Nixon Peabody LLP (57) ABSTRACT

The invention proposes a MEMS component having a crystalline base body (GK), a recess (AN) and a structured assembly (A) which closes said recess, in which an opening (OG) is structured in a first functional layer (MN), the effective opening cross section thereof varying as a function of the pressure difference on the two sides of the first functional layer (MN).

17 Claims, 3 Drawing Sheets

(56) References Cited

U.S. PATENT DOCUMENTS

2014/0084396 A1* 3/2014 Jenkins ............... B81B 3/0021
                                                     257/419

FOREIGN PATENT DOCUMENTS

| JP | 2006157863 | | 6/2006 |
| JP | 2012024897 | A | 2/2012 |
| WO | 2005/092782 | A1 | 10/2005 |
| WO | 2006/123263 | A1 | 11/2006 |
| WO | 2008/089328 | A1 | 7/2008 |

* cited by examiner

MEMS COMPONENT AND METHOD FOR THE PRODUCTION THEREOF

CROSS-REFERENCE TO RELATED APPLICATIONS

This application is a U.S. National Stage of International Application No. PCT/EP2013/066208, filed Aug. 1, 2013, which claims the benefit of German Patent Application No. 10 2012 107 457.7, filed on Aug. 14, 2012, both of which are incorporated herein by reference in their entirety.

In order to measure pressures and in particular for use as a microphone, MEMS components formed as sensors can be used. Such MEMS sensors can operate in accordance with the capacitor principle and then have an electrically conductive diaphragm and a fixed electrode arranged at a distance therefrom. The capacitance, which varies on account of the diaphragm deflection, is registered as a measured value.

The sensitivity of a MEMS microphone is determined, amongst other things, by the mechanical stability of its diaphragm. In order to detect even slight pressure differences, endeavors are made to use thin and easily deflectable diaphragms. However, these have the disadvantage that they can be damaged under the action of a high sound pressure or a rapid pressure rise. In this case, diaphragm and/or fixed electrode can break and thus the microphone or the pressure sensor can be destroyed.

One possible way of better reducing the sensitivity to rapidly rising high pressure lies in providing a pressure equalizing opening in the diaphragm and configuring the latter to be sufficiently large in order that excessively high relative pressures can be dissipated more quickly. However, this leads to a higher lower limiting frequency LLF in the microphone response. As a result, the noise of the microphone is increased and the signal/noise ratio SNR is reduced. Therefore, the lower frequency band is also limited and thus the sensitivity to low frequencies is impaired. However, the higher the LLF value is set, the lower is the risk of diaphragm or fixed electrode damage during rapid pressure rises or high pressure differences. At the same time, however, the performance of the sensor is reduced drastically.

The object of the present invention is therefore to specify a MEMS component that can be used as a pressure sensor or microphone, the diaphragm of which also withstands better rapid rises as far as high sound pressures than known solutions, without in the process making the performance of the sensor too much worse. A partial object consists in providing such a component in a simple production manner.

According to the invention, this object is achieved by a MEMS component according to claim 1. Advantageous refinements of the invention emerge from further claims.

The MEMS component is based on the idea of not enlarging the pressure equalizing opening permanently but instead configuring the latter such that it varies the opening cross section thereof variably and as a function of rising pressure differences.

A MEMS component has a crystalline base body, which serves as a carrier for the MEMS structures and serves as a material that can be structured for further MEMS structures. The base body of the component has a recess. Arranged on the base body is a structured assembly which comprises one or more functional layers and which covers the recess. An opening, the effective opening cross section of which varies as a function of the pressure difference on the two sides of the layer, is structured in the first functional layer of the assembly.

Such a variable opening is able to perform the function of a pressure relief valve.

A simple opening acting as a valve is implemented by a valve flap which opens under the action of pressure, or which opens by an appropriate amount as a function of the level of the pressure acting. A simple implementation of such a flap valve is achieved by structuring a two-dimensional slit pattern in a layer of the assembly that covers the recess, here in the first functional layer. By means of the slit pattern, a valve flap is formed. This is connected by a first end to the remaining first functional layer. At another end, the valve flap is structured so as to be free, so that, under a pressure loading acting on the layer on one side, it is able to fold out of the plane of the layer with this freely structured end. At the first end, the valve flap is connected to the remaining functional layer via a connecting web. The width of the connecting web can be chosen such that a suitable spring constant and therefore a desired deflection response of the valve flap as a function of the pressure rise is established.

The slit pattern follows the periphery of the valve flap, the valve flap being separated continuously from the remaining functional layer in three directions. At the first end, corresponding to the fourth direction, the slit pattern severs the layer only along part of the periphery, so that the slit pattern follows the periphery over more than 75% of the length of the latter. In other words, this means that in the case of a valve flap that is square, for example, the width of the valve flap is greater than the width of the connecting web which connects the valve flap to the remaining surface region of the functional layer. In the case of valve flaps which are formed to be more elongated in shape, the slit pattern follows the periphery over a substantially greater proportion of, for example, more than 80%, more than 90% or advantageously more than 95% of the length of the latter. This leads to the situation where the width of the connecting web and therefore the force constant which counteracts the deflection of the valve flap can be kept small.

The slit pattern can define any desired periphery. In addition to angular basic shapes for the periphery of the valve flap, round peripheries or partially rounded peripheries and mixed shapes and other shapes are also suitable. At the first end, at which the valve flap is connected to the remaining functional layer via the connecting webs, the periphery is not defined by the slit pattern that is interrupted here but by the shortest connecting line between the ends of the slit pattern. Accordingly, the periphery at the first end of the valve flap has a straight edge, at least in the region of the connecting web. Otherwise, it can be rounded, partly or wholly, at both ends. However, the periphery can also have one, two, three or four corners.

The slit pattern always follows the periphery of the valve flap, apart from the region which is formed by the connecting webs. It is possible to provide two or more connecting webs arranged at a distance from one another for one and the same valve flap. In this case, the slit pattern is pierced repeatedly along the periphery of the valve flap and forms a corresponding number of connecting webs with the rest of the functional layer.

The width of the connecting web or webs, in conjunction with the material constants of the layer, determines the force which is required to deflect the valve flap. A smaller spring constant effects more rapid deflection of the valve flap, which then takes place even at lower pressure differences on the two sides of the valve flap or on the two sides of the first functional layer. Thus, more rapid opening of the valve formed by the valve flap takes place.

In the non-deflected state, the slit pattern, that is to say the area of the slits of the slit pattern measured in the plane of the functional layer, determines the size of the opening and therefore the rapidity of the pressure equalization. The size of the valve flap defined by the (outer) periphery then determines the maximum cross-sectional area of the opening. The larger this cross-sectional area, the more rapidly pressure equalization can take place.

However, it is also possible to provide a plurality of openings and therefore a plurality of valve flaps in the layer. In this case, it is also possible to provide different valve flaps with a different area, different valve flaps with a different spring element determined by the width of the connecting web or webs, or different valve flaps with a differently shaped periphery. In addition, the opening direction can vary. This is achieved by the axes along which the valve flap opens being arranged at an angle with respect to one another. In the case of a plurality of valve flaps with parallel axes, the opening direction of the valve flaps can vary by 180°.

If the different valve flaps have different spring constants, the entire pressure-dependent response of the valve flaps, that is to say the dependence of the whole of the opening cross section of all the valve flaps on the pressure rise, can be adapted in a desired way. A suitable response can be achieved, for example, if first valve flaps with a small spring constant but relatively small outline are provided, opening even in the presence of relatively small pressure differences. Since, as a rule, only relatively large pressure differences can cause damage to the diaphragm, a rapid increase in the opening cross section is advantageous, which is achieved with a larger valve flap area in the case of second valve flaps which each however have a higher spring constant or a wider connecting web.

In one embodiment of the MEMS component, the functional layer having the opening is adjusted to be electrically conductive and formed as a diaphragm of the component. Arranged in parallel with and at a distance from the functional layer having the opening, a pierced solid electrode is arranged in the assembly as a further functional layer. Here, the diaphragm is a first functional layer, which covers the recess and as a result encloses a back volume in the recess. Such a MEMS component can be used as a pressure sensor or microphone. The pierced solid electrode in the assembly can be arranged closer to the base body than the diaphragm. However, it is also possible for the fixed electrode to be arranged above the diaphragm, that is to say on the side of the diaphragm that points away from the base body. In any case, the pierced fixed electrode has a hole pattern or forms a lattice, by which the diaphragm of the MEMS component is connected to the surrounding atmosphere, so that the pressure prevailing in the surroundings is also present on the diaphragm. An opposing pressure is provided by the back volume via the atmosphere enclosed by the latter, counteracting the deflection of the diaphragm and also the deflection of the valve flap.

The diaphragm of the MEMS component can deflect toward both sides, depending on the pressure gradient. In addition, in the event of an excessively high outward deflection of the diaphragm, damage can be caused to the diaphragm, which is avoided by the proposed configuration of the valve flap.

By using the proposed MEMS component, in the first functional layer of which, covering the recess, an opening is structured, the effective opening cross section of which varies as a function of the pressure difference on the two sides of the layer, more rapid pressure equalization in the event of rapidly rising or falling external pressures is made possible. This leads to the situation in which, although a dynamic response of the first functional layer, formed as a diaphragm, for example, remains possible, excessively high peaks are flattened. Slowly rising or falling pressures are then dissipated and equalized by the opening provided by the slit pattern. Via the size and spring constant of the valve flaps, a maximum deflection of the layer functioning as a diaphragm can be adjusted, with the result that damage to the first or even to the further functional layer becomes impossible.

A limiting pressure $P_G$, above which the valve flap opens to a noticeable extent, can be set via the spring constant of the valve flap. Such a limiting pressure can then be set virtually as desired on the basis of the desired application and the desired sensitivity thereof.

For microphone applications, this value can be chosen to be between 0.05 and 1.00 bar, between 0.1 and 0.8 bar, between 0.15 and 0.60 bar or between 0.2 and 0.5 bar.

The functional layer serving as a diaphragm can comprise a polysilicon layer. Polysilicon can be set to be electrically conductive with the aid of dopants. In this way, it is possible to form the diaphragm as an electrode of a capacitively operating MEMS component. The second electrode is formed by the fixed electrode, likewise set to be electrically conductive.

The diaphragm of the MEMS component can also be formed with multiple layers, of which the polysilicon layer forms a partial layer, preferably the central partial layer of a symmetrical layer structure. However, it is also possible to form a partial layer of the diaphragm as a metal layer; other partial layers, on the other hand, from dielectric or electrically insulating materials.

A suitable layer structure for a diaphragm comprises a polysilicon layer embedded symmetrically between two silicon nitride layers.

The production of the proposed MEMS component, in exactly the same way as the production of known MEMS components, requires structuring of the diaphragm both in the two-dimensional extent and also the production of the opening. As distinct from known MEMS components, the structuring with two-dimensional openings is then carried out in such a way that a valve flap is formed via a suitable slit pattern. The component can therefore be produced without increased outlay on fabrication and requires neither more complex nor additional method steps.

In the following text, the invention will be explained in more detail by using exemplary embodiments and the associated figures. The figures are formed only schematically and not to scale, so that neither absolute nor relative dimensional information can be gathered from the figures. Identical or identically acting parts are designated by the same designations.

Figure 1A:
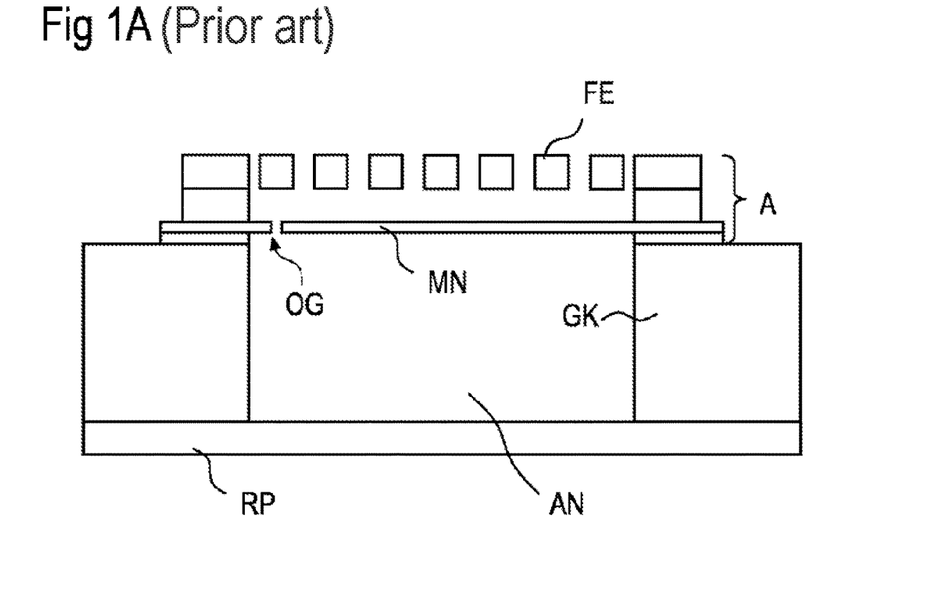
FIG. 1A shows a known MEMS microphone in schematic cross section.

FIG. 1A shows a MEMS microphone known from the prior art in schematic cross section. By using this figure, the basic functioning of the component will be explained below. Apart from the openings and the function, the structure and the function of the component according to the invention coincide with that of the known MEMS component described here.

The MEMS component has a crystalline base body GK, in which a recess AN, preferably having vertical sidewalls, is structured. Arranged on the upper side of the base body GK is an assembly A, here comprising a plurality of functional layers. This assembly comprises a first functional layer MN, which is formed as a diaphragm, and a second functional layer, which is formed as a fixed electrode FE. The two functional layers of the assembly A cover the recess and are arranged at a distance from and parallel to each other. The first functional layer MN extends over the entire recess and seals the latter off at the top. The back volume enclosed as a result is then connected to the atmosphere above the MEMS component only by a small and, for example, round opening OG for the purpose of slow pressure exchange.

In the region outside the recess AN, the layer structure A can comprise further layers or functional layers, which in particular serve as spacers between first and second functional layer and, for example, can constitute residues of sacrificial layers, with the aid of which the structuring of free interspaces between functional layers is achieved. Furthermore, the further layers also serve to anchor the functional layer in the edge region of the subsequent diaphragm and preferably in the edge region of the recess on the surface of the base body GK.

Such a component can be used as a microphone and, for example, can be operated as a capacitive component. To this end, first functional layer MN and second functional layer FE are set to be electrically conductive and form two capacitive electrodes, the electrical connection of which is not illustrated in the schematic figure.

The recess AN is closed on the underside of the base body GK by a back plate RP, which is produced together with the component or represents part of a surface on which the MEMS component is mounted. The back plate RP can also be part of the base body GK. In this way, enclosed within the recess is a back volume, which can be used as a reference for measuring external pressures or sound waves which produce pressure differences on the two sides of the diaphragm. The pressure difference between external pressure and the internal pressure within the back volume leads to a deflection of the diaphragm MN, as a result of which the distance to the fixed electrode FE, and therefore the capacitance of the capacitor, changes. This value can be used as a measure for the signal strength or the pressure difference and, via appropriate amplifier circuits, can be output as a usable signal. Pressure equalization is produced via the opening OG, the time period required for this purpose depending on the size of the opening and on the cross-sectional area of the opening OG, which is constant in known MEMS components.

Figure 1B:
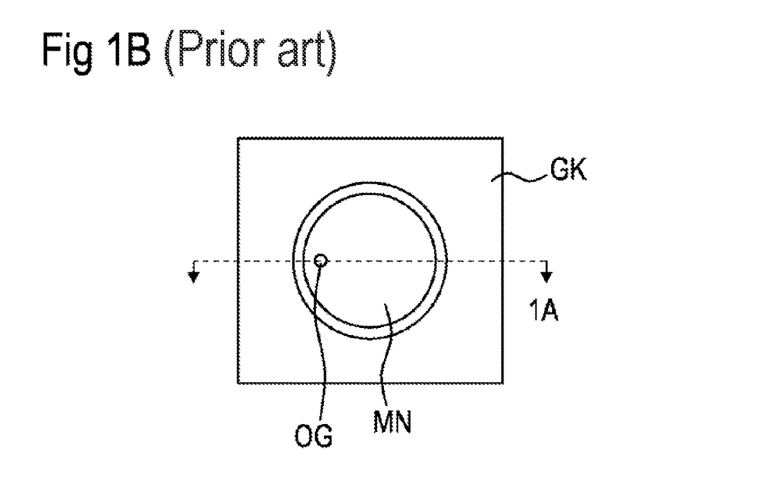
FIG. 1B shows the same microphone in plan view.

FIG. 1B shows the same MEMS component in plan view, in which the opening OG provided for the pressure equalization is illustrated better. Here, the diaphragm has a round outline but is not restricted to round shapes, just as little as the base body GK is restricted to rectangular shapes.

If diaphragm MN and fixed electrode FE are arranged at a preferably short distance from each other, large pressure differences which are present on the diaphragm MN can lead to such a high deflection of the diaphragm that the latter strikes the fixed electrode, and thus there is the risk of destruction of or damage to the diaphragm.

Figure 2A:
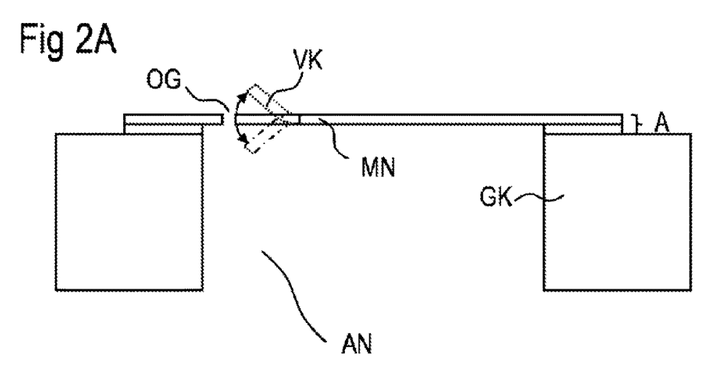
FIG. 2A shows a MEMS component according to the invention in schematic cross section.

FIG. 2A shows a schematic cross section through a proposed MEMS component, which avoids these problems. The MEMS component has a crystalline base body GK, in which once more a recess AN piercing the base body is provided. On the upper side, the recess is covered by an assembly A. The assembly comprises at least a first functional layer MN. Provided in the first functional layer is an opening OG, which is used for pressure equalization. However, the arrangement which, to this extent, is known as a partial structure from the prior art is now configured further such that, by means of suitable structuring of the opening OG, the latter acts like a valve, which varies the opening cross section of the opening OG as a function of the pressure difference which is present on the first functional layer MN. In the figure, the diaphragm (the first functional layer) is illustrated by a continuous line in the basic state of the component and with a normally large opening OG. A dotted line illustrates the component in a situation in which the pressure underneath the first functional layer MN is greater than above the first functional layer. This leads to a deflection of the valve flap as a part of the first functional layer in such a way that the cross section of the opening OG is enlarged. A dash-dotted line illustrates a situation in which the pressure above the first functional layer MN is greater than the pressure underneath the first functional layer. This leads to a deflection of the movable functional layer downward and therefore likewise to an enlargement of the cross-sectional area of the opening OG.

The movable part is structured in the first functional layer by using a slit pattern, with the aid of which a valve flap VK is defined.

Figure 2B:
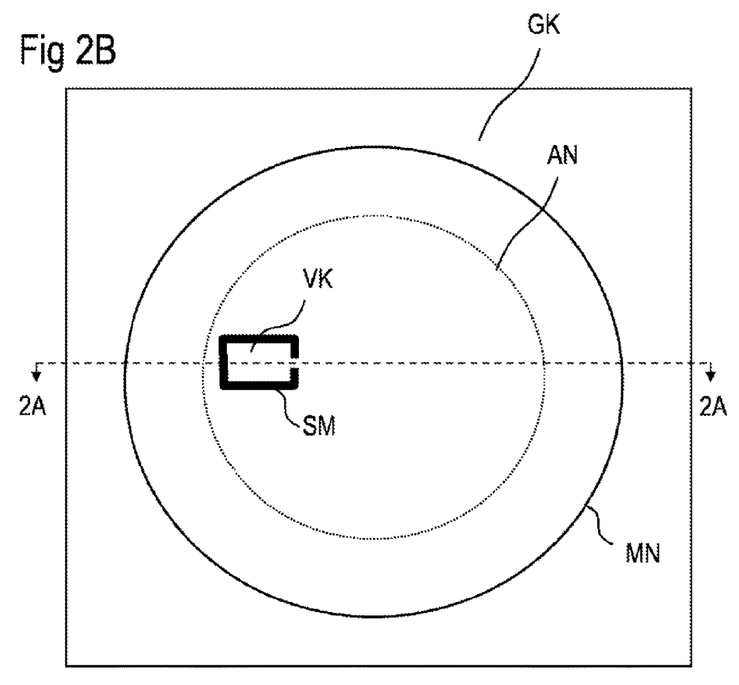
FIG. 2B shows the same component in plan view.

FIG. 2B shows a simple possible way of structuring such a valve flap VK. The figure shows the component illustrated in FIG. 2A in plan view. The slit pattern SM pierces the first functional layer MN along its entire length. The slit pattern follows the periphery of the valve flap VK apart from a connecting web, with which the valve flap is and remains connected to the remaining area of the first functional layer MN. The valve flap, free of connections to the functional layer at the second end, is then able to fold out of the layer plane and, in the process, remains connected to the remaining functional layer MN via the connecting web.

The slit pattern SM pierces the first functional layer MN and therefore already constitutes an opening OG, which is able to produce pressure equalization between the two sides of the first functional layer at a certain speed dependent on the size of the opening. Up to a limiting pressure $P_G$ the pressure acting on the valve flap VK is not yet sufficient to move the latter out of the layer plane to an extent worth mentioning.

In the event of an effective pressure $P_E$ (or pressure difference) acting above the limiting pressure $P_G$, the force acting on the valve flap is sufficient to deflect the latter out to such an extent that the effective cross section of the opening OG is noticeably enlarged. Depending on the level of deflection, the cross-sectional area of the opening OG can rise at most as far as the area enclosed by the outer periphery of the valve flap. Such an enlarged opening with a high pressure or pressure difference acting leads to more rapid pressure equalization and therefore to dissipation of the forces acting on the first functional layer MN. In this way, an excessively high deflection of the first functional layer MN as a result of excessively high pressures, and therefore damage to the same, is avoided.

Figure 3A:
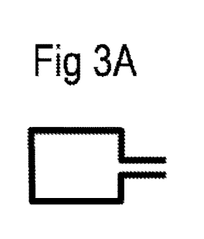
FIGS. 3A to 3H show various embodiments of slit patterns.

FIGS. 3A to 3H show exemplary possible different configurations of the slit pattern and the valve flap VK defined by the slit pattern. FIG. 3A shows a slit pattern which defines a rectangular to square valve flap and a connecting web VS. The width of the connecting web VS is preferably lower than that side length of the four-cornered valve flap VK to which the connecting web VS is connected. In FIG. 3A, the connecting web VS is still defined on both sides by lines running parallel to the web, so that a length of the connecting web VS is also predefined by the slit pattern.

Figure 3B:
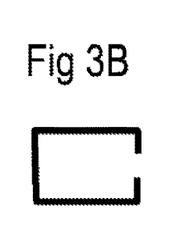

FIG. 3B shows an embodiment of the slit pattern SM in which the connecting web is defined only by a gap in the periphery. Here, too, the width of the connecting web VS substantially determines the force which is required to deflect the valve flap out of the layer plane. The width of the connecting web here is defined by the distance assumed by the two ends of the slit pattern in relation to each other. Along this distance, they do not follow the periphery of the valve flap.

The connecting web VS therefore constitutes an interruption to the slit pattern.

Figure 3C:
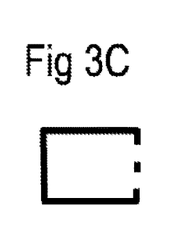

FIG. 3C shows a similar arrangement but in which the slit pattern is interrupted twice, so that two connecting webs VS are formed. Both connecting webs are arranged at the same end of the valve flap and the slit pattern. However, it is also possible to provide a plurality of connecting webs on different sides of the slit pattern.

Figure 3D:
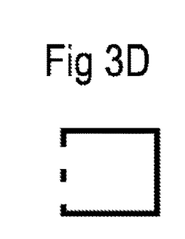

FIG. 3D shows virtually the same arrangement as FIG. 3C, only the connecting webs being provided on the opposite side of the slit pattern.

Figure 3E:
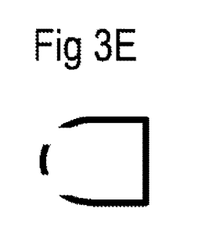
Figure 3F:
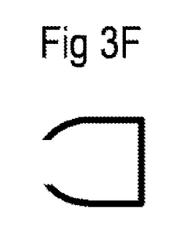
Figure 3G:
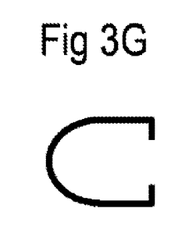
Figure 3H:
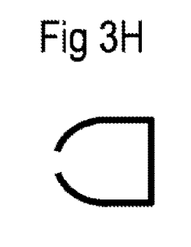

Apart from the rectangular shapes for a slit pattern or for peripheries of the valve flap, any other desired shapes can also be provided. For example, it is possible to round off at least one end of the periphery, at least to some extent. FIG. 3E shows an arrangement in which the first end, via which the valve flap is connected to the remaining functional layer, is rounded off. The opposite end has an approximately rectangular shape. FIG. 3F shows a slit pattern which follows the same or a similar periphery but in which, instead of two connecting webs, only one connecting web is provided at the rounded-off end. FIG. 3G shows a periphery similar to FIG. 3F, in which the connecting web is provided at the rectangularly shaped first end, while the second end is rounded off. FIG. 3H shows a slit pattern which follows a similar periphery to FIGS. 3E to 3G but in which the connecting web is provided at the rounded-off end. As compared with the slit pattern of FIG. 3F, the width of the connecting web is reduced here.

MEMS components according to the invention can therefore be formed as in FIG. 2A and have slit patterns as illustrated in FIGS. 3A to 3H.

The slit patterns formed by way of example in accordance with FIGS. 3A to 3H are preferably arranged close to the edge region of the first functional layer MN but above the recess AN. However, it is also possible to provide a plurality of slit patterns in the functional layer above the recess AN. Different slit patterns can be shaped differently, can define valve flaps VK of different sizes with their periphery, can have differently wide connecting webs and therefore exhibit a different response to pressure differences. However, it is also still possible, in addition to the slit pattern SM, to provide conventional openings OG, the opening cross section of which is non-variable. In this way, it is also possible to better set that effective opening cross section of the openings OG which, without any pressure difference or in the case of only non-hazardous low pressure differences, is provided below the limiting pressure $P_G$ on the two sides of the first functional layer.

A MEMS component as illustrated in FIG. 2A with a slit pattern according to the invention can be used as a pressure relief or under-pressure valve for any desired applications. A preferred application is found by the MEMS component illustrated in FIG. 2A but in a further configuration, in which it is extended to form a MEMS pressure sensor or a MEMS microphone. Here, it can be provided, in a known manner similar to that in FIG. 1A, with a second functional layer, which represents the fixed electrode FE of the pressure sensor or microphone. In a further embodiment, not illustrated, the MEMS component can have two fixed electrodes FE, the second fixed electrode FE then being arranged under the first functional layer serving as a diaphragm MN. Such a microphone can be operated differentially and permits the measured value to be registered more accurately.

In a MEMS pressure sensor or a MEMS microphone, the first functional layer MN formed as a diaphragm MN is preferably an electrically conductively doped polysilicon layer. In order to increase the mechanical stability, the first functional layer can have a multilayer assembly. The polysilicon layer is preferably embedded in between two mechanically stable layers, for example between two silicon nitride layers. It is also possible to provide the first functional layer formed as a diaphragm MN as a metallic layer.

The remaining functional layers of the assembly A are preferably built up from structurally stable and, if appropriate, electrically conductive layer materials.

In general, the production of the assembly A is achieved via layer deposition methods on the base body GK, preferably in a method step before the recess AN is produced. By means of different structuring steps between the individual layer depositions, partial layers can be structured. However, it is also possible to structure a plurality of functional layers of the assembly simultaneously. Cavities between functional layers can be produced, by sacrificial material being deposited there and dissolved out only in a later method step. Structuring steps are preferably achieved by means of chemical or physical etching methods, it being possible for the structure to be predefined via a resist. However, it is also possible to perform the structuring by means of locally accurate material removal directly and without any resist mask.

In the case of operation of a MEMS component formed as a pressure sensor or microphone, the underside of the recess AN is covered by a back plate RP. This can be produced by appropriate layer depositions, similarly to the assembly A. In this case, in a first method step, the back plate has openings, through which the recess AN can be produced by means of etching. The openings are then closed again in a second or further method step.

However, it is also possible to close the recess AN on the underside by means of a chip as back plate RP, preferably by means of a semiconductor chip, on which the MEMS component is mounted. However, it is also possible to use other solid carrier materials to close the cavity formed by the recess or to mount the MEMS component on a printed circuit board in such a way that the recess is sealed off at the bottom and the back volume is closed off.

The proposed MEMS component has the advantage that it can be produced in a known way without any additional method outlay. While, hitherto, round or similarly shaped openings OG in the diaphragm were structured, a slit pattern, which can be produced without additional outlay, is now structured in stead. A MEMS microphone obtained in this way has a lower lower limiting frequency LLF, reduces the noise and therefore exhibits an improved signal/noise response.

The component has a normal operating mode, in which it responds like a conventional MEMS microphone. Above a limiting pressure $P_G$ the expansion according to the invention of the opening cross section of the openings OG is so great that it leads to more rapid pressure equalization. This reduces the pressure difference on the two sides of the diaphragm more quickly and therefore leads to lower deflection of the diaphragm. As a result, the risk that the diaphragm or the adjacent fixed electrode will be damaged by excessively high deflection of the diaphragm is reduced.

The invention is not restricted to the exemplary embodiments or the figures. The basic idea of the invention is grounded solely in providing an opening cross section in the diaphragm of a MEMS component which varies as a function of the applied pressure.

LIST OF DESIGNATIONS

GK Crystalline base body
AN Recess
A Structured assembly
MN First functional layer, diaphragm
OG Opening
Opening cross section of the opening
SM Two-dimensional slit pattern
VK Movable valve flap
FE Fixed electrode
RP Back plate
$P_E$ Effective pressure
$P_G$ Limiting pressure

The invention claimed is:
1. A MEMS component
having a crystalline base body, which has a recess
having a structured assembly on the base body, which comprises at least a first functional layer or a plurality of functional layers and covers the recess,
in which an opening, the effective opening cross section of which varies as a function of the pressure difference on the two sides of the first functional layer, is structured in the first functional layer of the assembly in the region above the recess
in which the opening is formed by a two-dimensional slit pattern piercing the first functional layer,
in which the slit pattern additionally defines a valve flap which, at least a first end, is connected via a connecting web to the remaining portion of the area of the first functional layer and is structured so as to be free at a second end,
in which the valve flap is able to fold out of the layer plane of the first functional layer, starting from a predetermined pressure loading on one side, and therefore is able to enlarge the cross section of the opening,
in which a width of the connecting web across the first end of the valve flap is reduced relative to the second end of the valve flap.

2. The MEMS component according to claim 1,
in which the valve flaps are formed in such a way that the cross section of the opening is limited to the area of the two-dimensional slit pattern which pierces the first functional layer as long as an applied effective pressure $P_E$, which corresponds to the pressure difference, is lower than a predefined limiting pressure $P_G$
in which in the event of a real pressure $P_E$ acting on the component, where $P_E \geq P_G$, the valve flap folds out,
in which the limiting pressure $P_G$ is chosen such that damage to the component in the event of loading with the limiting pressure is ruled out or not to be expected.

3. The MEMS component according to claim 1,
in which the size of the valve flap is defined by a closed periphery
in which the slit pattern is interrupted and pierced repeatedly along the periphery of the valve flap, so that the valve flap is connected to the remaining portion of the area of the first functional layer at the first end via two or more connecting webs arranged at a distance from one another.

4. The MEMS component according to claim 1,
in which the size of the valve flap is defined by a closed periphery
in which the slit pattern follows the periphery over more than 75%, more than 80%, more than 90% or more than 95% of its length,
wherein the proportion of the slit pattern missing from 100% at the periphery corresponds to the width of the connecting web or the connecting webs.

5. The MEMS component according to claim 1,
in which the valve flap has a rounded periphery at the first end, at the second end or at both ends.

6. The MEMS component according to claim 1,
in which the periphery has at least one corner.

7. The MEMS component according to claim 1,
which has more than one valve flap.

8. The MEMS component according to claim 1,
in which valve flaps of different sizes, of which the opening cross sections have different pressure dependencies, are formed.

9. The MEMS component according to claim 1,
in which the first functional layer having the opening is formed so as to be electrically conductive and constitutes a diaphragm of the MEMS component,
in which the assembly has a pierced fixed electrode as a second functional layer parallel to and at a distance from the first functional layer having the opening
in which the diaphragm encloses a back volume in the recess
the MEMS component can be used as a pressure sensor or microphone.

10. The MEMS component according to claim 9,
in which the diaphragm comprises a polysilicon layer or a metal layer.

11. The MEMS component according to claim 9,
in which the valve flap can fold out of the layer plane of the first functional layer in both directions.

12. The MEMS component according to claim 2,
in which the limiting pressure $P_G$ is set via dimensioning the width of the connecting webs to a value which lies between 0.05 and 1.00 bar, between 0.1 and 0.8 bar, between 0.15 and 0.60 bar or between 0.2 and 0.5 bar.

13. A method for producing a MEMS component according to claim 1,
in which the structured assembly made of at least the first functional layer is applied to the base body and is structured
in which, for the purpose of structuring the first functional layer, the outline of the latter is defined and the slit pattern is produced in an integrated manner together with the two-dimensional structuring
in which the slit pattern follows the periphery of the valve flap over more than 75% of the length thereof
in which the recess is produced in the base body and is covered by the functional layer such that a volume is enclosed therein,
in which the slit pattern is produced in the region above the recess.

14. The method according to claim 13,
in which a sacrificial layer is applied over the entire area above the first functional layer following the structuring thereof in which, following the production of the recess, the sacrificial layer is etched out or dissolved out completely, at least in the region above the recess.

15. The MEMS component according to claim 2,
in which the size of the valve flap is defined by a closed periphery
in which the slit pattern is interrupted and pierced repeatedly along the periphery of the valve flap, so that the valve flap is connected to the remaining portion of the area of the first functional layer at the first end via two or more connecting webs arranged at a distance from one another.

16. The MEMS component according to claim 2,
in which the size of the valve flap is defined by a closed periphery
in which the slit pattern follows the periphery over more than 75%, more than 80%, more than 90% or more than 95% of its length,
wherein the proportion of the slit pattern missing from 100% at the periphery corresponds to the width of the connecting web or the connecting webs.

17. The MEMS component according to claim 2, in which the valve flap has a rounded periphery at the first end, at the second end or at both ends.

* * * * *

UNITED STATES PATENT AND TRADEMARK OFFICE
CERTIFICATE OF CORRECTION

PATENT NO. : 9,991,822 B2
APPLICATION NO. : 14/420871
DATED : June 5, 2018
INVENTOR(S) : Pirmin Hermann Otto Rombach It is certified that error appears in the above-identified patent and that said Letters Patent is hereby corrected as shown below:

In the Claims

At Column 9, Line 38 (Claim 1, Line 14), please delete "which, at least a first end, is connected via a connecting" and insert --which, at at least a first end, is connected via a connecting-- therefor.

Signed and Sealed this
Sixth Day of November, 2018

Andrei Iancu
*Director of the United States Patent and Trademark Office*